US012772740B2

(12) United States Patent
Kobayashi et al.

(10) Patent No.: US 12,772,740 B2
(45) Date of Patent: Oct. 20, 2026

(54) PIEZOELECTRIC LAMINATE AND PIEZOELECTRIC ELEMENT

(71) Applicant: FUJIFILM Corporation, Tokyo (JP)

(72) Inventors: Hiroyuki Kobayashi, Kanagawa (JP); Kenichi Umeda, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 838 days.

(21) Appl. No.: 18/191,518

(22) Filed: Mar. 28, 2023

(65) Prior Publication Data

US 2023/0255116 A1 Aug. 10, 2023

Related U.S. Application Data

(63) Continuation of application No. PCT/JP2021/022403, filed on Jun. 11, 2021.

(30) Foreign Application Priority Data

Sep. 30, 2020 (JP) ................................ 2020-166409

(51) Int. Cl.

*H01L 41/00* (2013.01)
*H10N 30/00* (2023.01)
*H10N 30/853* (2023.01)
*H10N 30/87* (2023.01)

(52) U.S. Cl.

CPC ....... *H10N 30/8554* (2023.02); *H10N 30/704* (2024.05); *H10N 30/877* (2023.02)

(58) Field of Classification Search

CPC ......................... H10N 30/8554; H10N 30/877

See application file for complete search history.

(56) References Cited

U.S. PATENT DOCUMENTS

| | | | | |
|---|---|---|---|---|
| 2006/0046319 | A1* | 3/2006 | Takeda | H10N 30/082 438/240 |
| 2007/0247260 | A1* | 10/2007 | Yanase | H03H 9/02133 333/187 |
| 2008/0231667 | A1 | 9/2008 | Arakawa et al. | |
| 2010/0314972 | A1 | 12/2010 | Suenaga et al. | |

(Continued)

FOREIGN PATENT DOCUMENTS

| | | | |
|---|---|---|---|
| JP | 11-233733 | A | 8/1999 |
| JP | 2006-100814 | A | 4/2006 |

(Continued)

OTHER PUBLICATIONS

European Communication pursuant to Article 94(3) EPC for corresponding European Application No. 21874828.3, dated Sep. 20, 2024.

Japanese Office Action for corresponding Japanese Application No. 2022-553466, dated May 21, 2024, with English translation.

European Communication pursuant to Article 94(3) EPC for corresponding European Application No. 21 874 828.3, dated Mar. 11, 2025.

(Continued)

*Primary Examiner* — Bryan P Gordon

(74) *Attorney, Agent, or Firm* — Birch, Stewart, Kolasch & Birch, LLP

(57) ABSTRACT

A piezoelectric laminate and a piezoelectric element, including on a substrate in the following order, a lower electrode layer, and a piezoelectric film, in which a region of the lower electrode layer, the region being in contact with the piezoelectric film, is constituted of a metal layer, where a (111) plane of the metal layer has an inclination of 1° or more with respect to a surface of the substrate, and the piezoelectric film contains a perovskite-type oxide containing Pb.

9 Claims, 8 Drawing Sheets

(56) References Cited

U.S. PATENT DOCUMENTS

| | | | | |
|---|---|---|---|---|
| 2011/0102515 | A1* | 5/2011 | Asaoka | H10N 30/2047 347/68 |
| 2011/0121690 | A1* | 5/2011 | Shibata | C04B 35/495 310/311 |
| 2011/0187237 | A1 | 8/2011 | Suenaga et al. | |
| 2013/0250007 | A1* | 9/2013 | Ishimori | B41J 2/1628 204/192.1 |
| 2019/0103550 | A1* | 4/2019 | Kobayashi | H10N 30/2047 |
| 2020/0212286 | A1* | 7/2020 | Ishii | C23C 14/088 |

FOREIGN PATENT DOCUMENTS

| | | | |
|---|---|---|---|
| JP | 2008-270704 | A | 11/2008 |
| WO | WO 2011/118093 | A1 | 9/2011 |

OTHER PUBLICATIONS

International Preliminary Report on Patentability and Written Opinion of the International Searching Authority (Forms PCT/IB/326, PCT/IB/373, and PCT/ISA/237) for International Application No. PCT/JP2021/022403, dated Apr. 13, 2023, with an English translation.

International Search Report (Form PCT/ISA/210) for International Application No. PCT/JP2021/022403, dated Aug. 31, 2021, with an English translation.

Extended European Search Report for corresponding European Application No. 21874828.3, dated Feb. 12, 2024.

European Communication pursuant to Article 94(3) EPC for corresponding European Application No. 21874828.3, dated Jun. 18, 2026.

* cited by examiner

PIEZOELECTRIC LAMINATE AND PIEZOELECTRIC ELEMENT

CROSS-REFERENCE TO RELATED APPLICATIONS

This application is a continuation of International Application No. PCT/JP2021/022403, filed on Jun. 11, 2021, which claims priority from Japanese Patent Application No. 2020-166409, filed on Sep. 30, 2020. The entire disclosure of each of the above applications is incorporated herein by reference.

BACKGROUND

1. Technical Field

The present disclosure relates to a piezoelectric laminate and a piezoelectric element.

2. Description of the Related Art

As a material having excellent piezoelectricity and excellent ferroelectricity, there is known lead zirconate titanate ($Pb(Zr,Ti)O_3$, hereinafter referred to as PZT). The PZT is used in a ferroelectric random access memory (FeRAM) which is a non-volatile memory, by taking advantage of the ferroelectricity thereof. Furthermore, in recent years, a MEMS piezoelectric element including a PZT film has been put into practical use by fusing with micro electro-mechanical systems (MEMS) technology. A PZT film is applied as a piezoelectric film in a piezoelectric element having a lower electrode, a piezoelectric film, and an upper electrode on a substrate. This piezoelectric element has been developed into various devices such as a memory, an inkjet head (an actuator), a micromirror device, an angular velocity sensor, a gyro sensor, and an oscillation power generation device.

In the piezoelectric film containing a lead-containing perovskite-type oxide represented by the PZT described above, at the time of forming a piezoelectric film on the lower electrode layer, a pyrochlore phase, which is an impurity layer, is easily generated at an interface with the lower electrode layer. The pyrochlore phase is paraelectric, and thus the decrease in the dielectric constant and the deterioration of the piezoelectric characteristics as a piezoelectric film occur in a case where the pyrochlore phase is formed. In a case where a piezoelectric film is used as a piezoelectric device, the higher the piezoelectric characteristics of the piezoelectric film, the better the device performance. In addition, the decrease in the piezoelectric characteristics leads to the decrease in the device performance, and thus it is desirable that the piezoelectric characteristics are high. Therefore, a method of suppressing the pyrochlore phase to improve the piezoelectric characteristics has been studied.

For example, JP1999-233733A (JP-H11-233733A) discloses that a seed layer that suppresses the growth of a pyrochlore phase is provided between a piezoelectric film and a lower electrode layer.

SUMMARY

However, forming a seed layer as in JP1999-233733A (JP-H11-233733A) has a disadvantage that the number of processes for forming the piezoelectric element increases and the manufacturing cost increases. In addition, in a case where the seed layer is made of an insulating material, or in a case where the film thickness of the seed layer is thick, there is also a demerit that a net electric field applied to the piezoelectric film in the electric field applied between the upper and lower electrode layers decreases, and thus the piezoelectric characteristics as the piezoelectric element deteriorate.

The technique of the present disclosure has been made in consideration of the above circumstances, and an object of the present invention is to provide, at a low cost, a piezoelectric laminate and a piezoelectric element, which have high piezoelectric characteristics.

Specific means for solving the above problems include the following aspects.

<1> A piezoelectric laminate comprising, on a substrate in the following order:
a lower electrode layer; and
a piezoelectric film;
in which a region of the lower electrode layer, the region being in contact with the piezoelectric film, is constituted of a metal layer, where a (111) plane of the metal layer has an inclination of 1° or more with respect to a surface of the substrate, and
the piezoelectric film contains a perovskite-type oxide containing Pb.

<2> The piezoelectric laminate according to <1>, in which a metal constituting the metal layer is at least one of Ir, Pt, Au, Mo, Ta, or Al.

<3> The piezoelectric laminate according to <1> or <2>, in which the lower electrode layer includes a first layer that consists of the metal layer and a second layer that is adjacent to the first layer and is provided on a substrate side, and the second layer contains at least one of Ti or W as a main component and contains more than 5 at % and less than 50 at % of oxygen or nitrogen.

<4> The piezoelectric laminate according to any one of <1> to <3>, in which in an X-ray diffraction pattern for the piezoelectric film, an intensity ratio of a pyrochlore phase to a perovskite phase in the piezoelectric film, which is represented by the following expression, is 2% or less, $$py(222)/\{pr(100)+pr(110)+pr(111)\}\times 100\%$$

here, py (222) is a peak intensity of a (222) plane of the pyrochlore phase,
pr (100) is a peak intensity of a (100) plane of the perovskite phase,
pr (110) is a peak intensity of a (110) plane of the perovskite phase, and
pr (111) is a peak intensity of a (111) plane of the perovskite phase.

<5> The piezoelectric laminate according to any one of <1> to <4>, in which the piezoelectric film has a columnar crystal film structure consisting of a large number of columnar crystals.

<6> The piezoelectric laminate according to <5>, in which a (100) plane or (001) plane of the columnar crystals has an inclination of 1° or more with respect to the surface of the substrate.

<7> A piezoelectric element comprising:
the piezoelectric laminate according to any one of <1> to <6>; and
an upper electrode layer provided on the piezoelectric film of the piezoelectric laminate.

<8> The piezoelectric element according to <7>, in which the upper electrode layer contains a metal or a metal oxide, containing at least one of Ir, Pt, Au, Ti, Mo, Ta, Ru, or Al.

The piezoelectric laminate and the piezoelectric element of the present disclosure have high piezoelectric characteristics and can be manufactured at a low cost.

DETAILED DESCRIPTION

Figure 1:
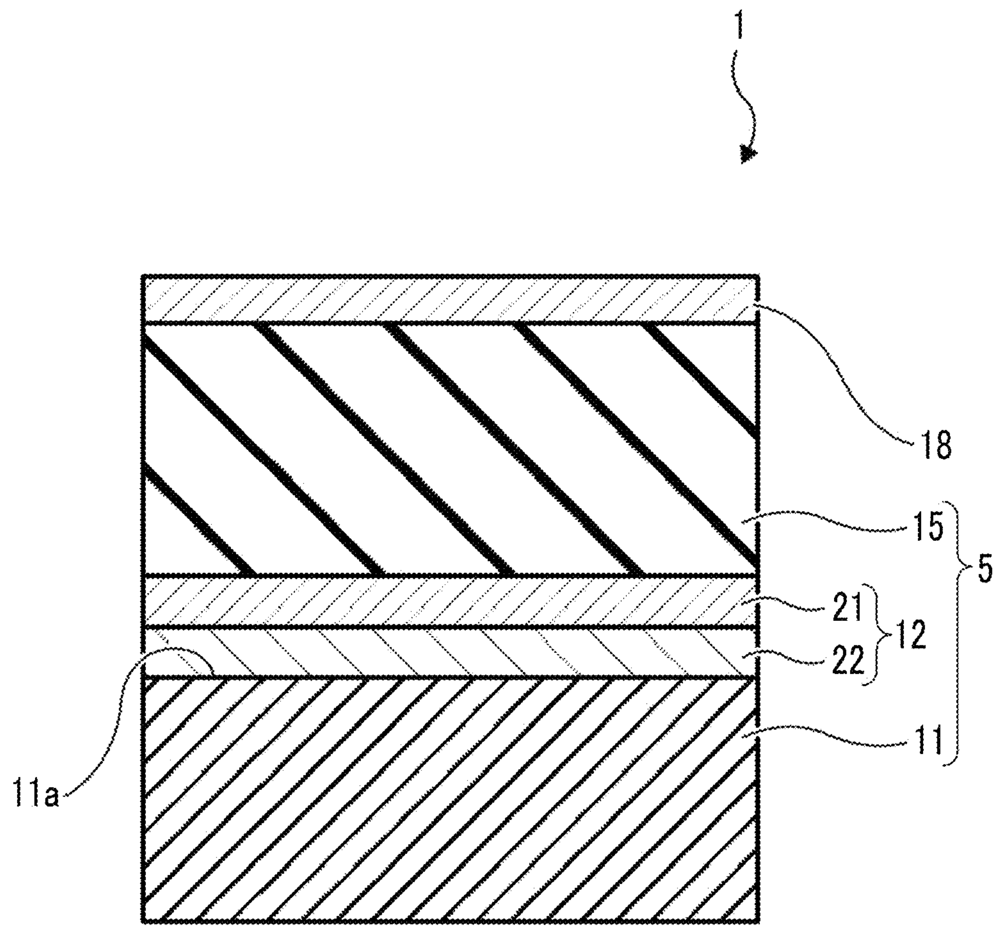
FIG. 1 is a cross-sectional view illustrating a layer configuration of a piezoelectric element according to one embodiment.

Hereinafter, embodiments according to the present invention will be described with reference to the drawings. In the drawings below, the layer thickness of each of the layers and the ratio therebetween are appropriately changed and drawn for easy visibility, and thus they do not necessarily reflect the actual layer thickness and ratio.

"Piezoelectric Element According to Embodiment"

FIG. 1 is a cross-sectional schematic view illustrating a layer configuration of a piezoelectric element 1 having a piezoelectric laminate 5, according to an embodiment. As illustrated in FIG. 1, the piezoelectric element 1 has the piezoelectric laminate 5 and an upper electrode layer 18. The piezoelectric laminate 5 has a substrate 11, and a lower electrode layer 12 and a piezoelectric film 15, which are laminated on the substrate 11. That is, the configuration of the piezoelectric element 1 is such that the upper electrode layer 18 is formed on the piezoelectric film 15 of the piezoelectric laminate 5. Here, "lower" and "upper" do not respectively mean top and bottom in the vertical direction. As result, an electrode disposed on the side of the substrate 11 with the piezoelectric film 15 being interposed is merely referred to as the lower electrode layer 12, and an electrode disposed on the side of the piezoelectric film 15 opposite to the substrate 11 is merely referred to as the upper electrode layer 18.

The substrate 11 is not particularly limited, and examples thereof include substrates such as silicon, glass, stainless steel, yttrium-stabilized zirconia, alumina, sapphire, and silicon carbide. As the substrate 11, a laminated substrate having a $SiO_2$ oxide film formed on the surface of the silicon substrate may be used.

The piezoelectric film 15 contains a perovskite-type oxide containing Pb. The piezoelectric film 15 basically consists of a Pb-containing perovskite-type oxide. However, the piezoelectric film 15 may contain unavoidable impurities in addition to the Pb-containing perovskite-type oxide. The perovskite-type oxide is represented by General Formula $ABO_3$. It is noted that although the standard ratio of A:B:O is 1:1:3, the ratio may deviate within a range in which the perovskite structure can be obtained. Pb is an A site element and is preferably contained as a main component of the A site. It is noted that in the present specification, "the main component" means a component of which the occupation is 50% by mole or more. That is, "contains Pb as the main component of the A site" means that the component having 50% by mole or more among the A site elements is Pb. In the perovskite-type oxide containing Pb, the elements in the A site other than Pb and the elements of the B site are not particularly limited.

The perovskite-type oxide containing Pb, constituting the piezoelectric film 15, is, for example, preferably a perovskite-type oxide represented by General Expression (1) below.

$$(Pb_{a1}\alpha_{a2})(Zr_{b1}Ti_{b2}\beta_{b3})O_c \quad (1)$$

In the formula, Pb and α are an A site element, where α is at least one kind of element other than Pb. Zr, Ti, and β are a B site element. Here, a1≥0.5, b1>0, b2>0, and b3≥0, and (a1+a2):(b1+b2+b3):c=1:1:3 are standardly satisfied, which may deviate from the standard values within a range in which a perovskite structure can be obtained.

In the perovskite-type oxide containing Pb, examples of the A site element other than Pb include lithium (Li), sodium (Na), potassium (K), magnesium (Mg), calcium (Ca), strontium (Sr), barium (Ba), lanthanum (La), cadmium (Cd), and bismuth (Bi). α is one of these or a combination of two or more of these.

Examples of the B site element other than Ti and Zr include elements such as scandium (Sc), vanadium (V), niobium (Nb), tantalum (Ta), chromium (Cr), molybdenum (Mo), tungsten (W), manganese (Mn), iron (Fe), ruthenium (Ru), cobalt (Co), iridium (Ir), nickel (Ni), copper (Cu), zinc (Zn), gallium (Ga), indium (In), tin (Sn), antimony (Sb), and lanthanide. β is one of these or a combination of two or more of these.

The film thickness of the piezoelectric film 15 is not particularly limited, and it is generally 200 nm or more, for example, 0.2 μm to 5 μm. The film thickness of the piezoelectric film 15 is preferably 1 μm or more.

The lower electrode layer 12 is an electrode for applying a voltage to the piezoelectric film 15. In the lower electrode layer 12, at least a region in contact with the piezoelectric film 15 is constituted of a metal layer, where a (111) plane of the metal layer has an inclination of 1° or more with respect to a surface of the substrate 11. The metal layer contains a metal that becomes an alignment film in which the (111) plane is parallel to the surface of the glass substrate in a case of being formed into a film on a glass substrate by sputter film formation, that is, a metal that is preferentially aligned in the (111) plane. In this example, the lower electrode layer 12 includes a first layer 21 that is in contact with the piezoelectric film 15 and a second layer 22 that is adjacent to the first layer 21 and is disposed on the substrate 11 side. In addition, the first layer 21, which is a region in contact with the piezoelectric film 15 consists of a metal layer containing a metal that is preferentially aligned in the (111) plane in a case of being formed into a film on a glass substrate by sputter film formation. It is noted that in the present specification, the "metal layer" may include, on the surface, an oxide region (an oxide film) formed by the natural oxidation of a surface. In this first layer 21, the (111) plane of the metal layer has an inclination of 1° or more with respect to a surface 11*a* of the substrate 11 (hereinafter, referred to as a substrate surface 11*a*). The (111) plane preferably has an inclination of 1° or more and 15° or less and more preferably has an inclination of 1° or more and 8° or less with respect to the substrate surface 11*a*.

Figure 2:
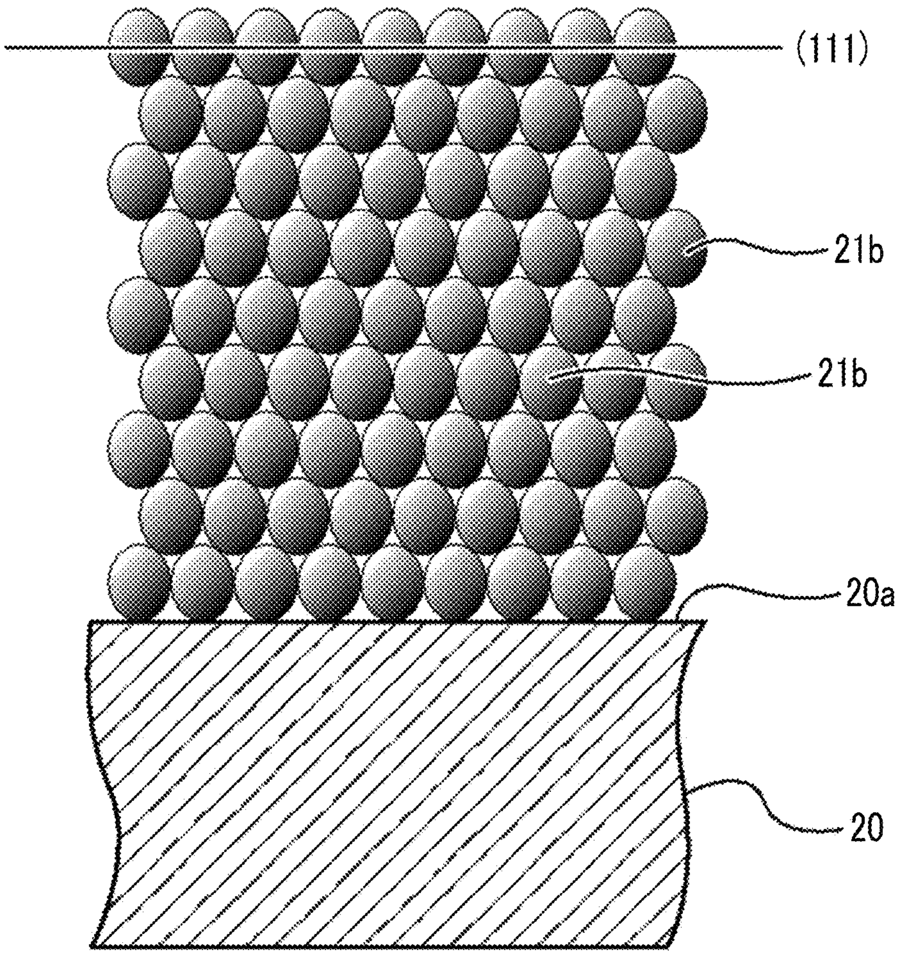
FIG. 2 is an explanatory view for a metal constituting the first layer of the lower electrode layer.
Figure 3:
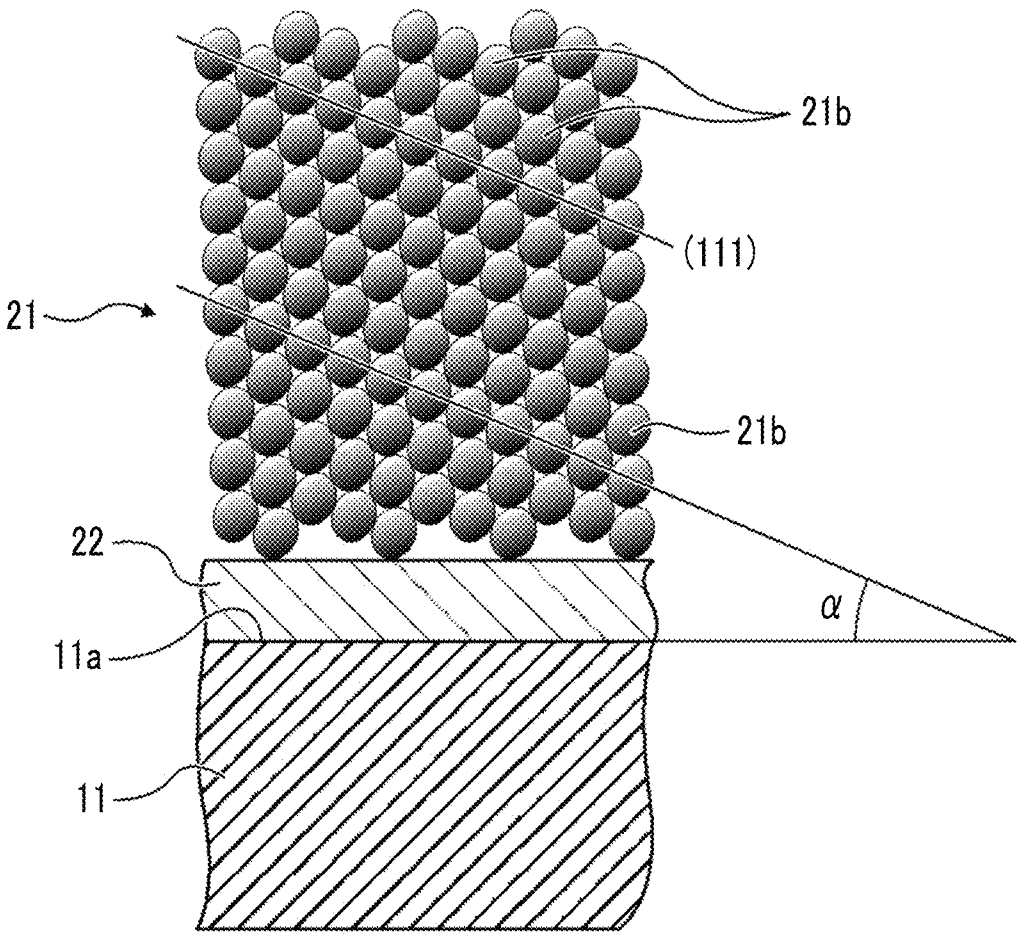
FIG. 3 is an explanatory view of an alignment state of the first layer of the lower electrode layer in the present embodiment.

FIG. 2 is a view schematically illustrating the alignment in a case where a film of a layer consisting of a metal that forms the first layer 21 is formed on a glass substrate 20 by sputter film formation. A particle 21*b* in FIG. 2 indicates a metal element. The metal used here is aligned such that a growth plane parallel to a surface 20*a* of the glass substrate 20 is the (111) plane in a case of being formed into a film on the glass substrate 20 by sputter film formation. That is, the (111) plane is aligned to be parallel to the surface 20*a* of the substrate 20. However, in this example, as illustrated in FIG. 3, the (111) plane of the first layer 21 has an inclination α of 1° or more with respect to the substrate surface 11*a*.

It is noted that the inclination α of the (111) plane in the first layer 21 is defined by a value measured by a rocking curve measurement by X-ray diffraction. Specifically, the inclination of the (111) plane is calculated from the split width of the (111) diffraction peak in the rocking curve measurement data (see Examples).

In a case where the (111) plane is preferentially aligned on the surface of the lower electrode layer 12 on which the piezoelectric film 15 is formed, a pyrochlore phase is easily formed at the time of the formation of the piezoelectric film 15 containing a perovskite-type oxide containing Pb. However, in the lower electrode layer 12 according to the present embodiment, the (111) plane of the metal layer that forms the first layer 21 of the lower electrode layer 12 has an inclination α of 1° or more with respect to the film formation surface parallel to the substrate surface 11*a*, as illustrated in FIG. 3. Therefore, it is possible to suppress the formation of the pyrochlore phase and to form the piezoelectric film 15 in which the pyrochlore phase is reduced as compared with a case where the surface of the lower electrode layer 12 is the (111) plane. In a case where the generation of the pyrochlore phase in the piezoelectric film 15 is suppressed, the proportion of the perovskite phase in the piezoelectric film 15 increases, and thus it is possible to obtain the piezoelectric laminate 5 and the piezoelectric element 1 having high piezoelectric characteristics. In addition, since a seed layer forming process is not required, it is possible to suppress an increase in cost and obtain the piezoelectric laminate 5 and the piezoelectric element 1 at a low cost as compared with a case where a seed layer for suppressing the pyrochlore phase is provided on the lower electrode layer.

In addition, in a case of suppressing the pyrochlore phase that is generated at the interface between the piezoelectric film 15 and the lower electrode layer 12, it is expected that the adhesiveness is improved, electrical defects are suppressed, and long-term durability is improved.

It is noted that the larger the inclination α of the (111) plane in the first layer 21 with respect to the substrate surface 11*a* is, the higher the effect of suppressing the growth of the pyrochlore phase, which is preferable. On the other hand, in a case of setting the inclination to 15° or less, it is possible to suppress another alignment plane becomes preferential, which is preferable.

In the lower electrode layer 12, the metal constituting the first layer 21 is preferably at least one of iridium (Ir), platinum (Pt), gold (Au), molybdenum (Mo), tantalum (Ta), or aluminum (Al). Ir or Pt is more preferable, and Ir is particularly preferable.

The second layer 22 of the lower electrode layer 12 contains at least one of Ti or W as a main component and contains more than 5 at % and less than 50 at % of oxygen or nitrogen. In a case where the second layer 22 contains both oxygen and nitrogen, the total content of both may be more than 5 at % and less than 50%. As described above, the metal constituting the first layer 21 is a metal that becomes an alignment film in which, in general, the (111) plane is parallel to the surface of the substrate surface 11*a* in a case of being formed into a film by sputter film formation. However, in a case where the above-described second layer is provided in an underlayer of the first layer 21, the (111) plane can be aligned to have an inclination with respect to the substrate surface 11*a*.

Regarding the region of the lower electrode layer 12, which is adjacent to the piezoelectric film 15, a method of forming a metal film in which the (111) plane has an inclination from the film formation surface is not limited to the method of providing the second layer 22.

The second layer is preferably Ti or TiW. In a case of being TiW, a ratio of Ti:W of 10 wt %:90 wt % is particularly preferable.

The amount of impurities such as oxygen and nitrogen added to the second layer 22 can be controlled by conditions during film formation sputter film formation. Although the sputter film formation is carried out in a vacuum chamber, some oxygen or the like remains as a background in the vacuum chamber. The amount of impurities incorporated into the film from the background can be adjusted, for example, by adjusting the distance between the substrate and the target during sputtering or the film formation rate. In a case of increasing the distance between the substrate and the target or reducing the film formation rate, a gas species that is used in sputtering, such as oxygen or argon, can be incorporated into the film. In addition, in a case of introducing oxygen or nitrogen gas into the sputter gas that is allowed to flow during film formation, more oxygen or nitrogen can be incorporated into the film. The more the contents of oxygen and nitrogen in the second layer 22, the lower the crystallinity of the second layer 22. In a case of reducing the crystallinity of the second layer 22, the (111) plane of the metal layer which is the first layer 21, a film of which is formed on the second layer 22, has an inclination with respect to the substrate surface 11*a*. In a case where the content of oxygen or nitrogen in the second layer 22 is more than 5 at %, the inclination of the (111) plane of the metal layer can be sufficiently increased. In a case where the content of oxygen or nitrogen in the second layer 22 is less than 50%, good adhesiveness to the substrate 11 can be maintained.

The total thickness of the lower electrode layer 12 including the first layer 21 and the second layer 22 is not particularly limited as long as the conductivity required for the device as the lower electrode layer 12 is ensured. For example, it may be about 50 nm to 300 nm or may be 100 nm to 300 nm. In the present embodiment, the lower electrode layer 12 has a two-layer structure. However, the lower electrode layer 12 may be a single layer or may have a laminated structure of three or more layers as long as at least the metal layer that forms a region in contact with the piezoelectric film 15 is an alignment film, and the (111) plane thereof has an inclination from the substrate surface 11*a*.

The upper electrode layer 18 is paired with the lower electrode layer 12 and is an electrode for applying a voltage to the piezoelectric film 15. The main component of the upper electrode layer 18 is not particularly limited, and examples thereof include, in addition to the materials exemplified in the lower electrode layer 12, electrode materials that are generally used in a semiconductor process such as chromium (Cr) and a combination thereof. The upper electrode layer 18 preferably contains a metal or a metal oxide, containing at least one of Ir, Pt, Au, Ti, Mo, Ta, Ru, or Al.

The thickness of the upper electrode layer 18 is not particularly limited, and it is preferably about 50 nm to 300 nm and more preferably 100 nm to 300 nm.

As described above, in the piezoelectric laminate 5 and the piezoelectric element 1 according to the present embodiment, the region (the first layer 21 in this example) of the lower electrode layer 12, which is in contact with the piezoelectric film 15, is constituted of a metal layer containing a metal that becomes an alignment film in which the (111) plane is parallel to the surface of the glass substrate in a case of formed into a film on a glass substrate by sputter film formation, and the (111) plane of the metal layer has an inclination of 1° or more with respect to the surface of the substrate. This makes it possible to suppress the generation of the pyrochlore phase between the piezoelectric film 15 and the lower electrode layer 12.

Figure 4:
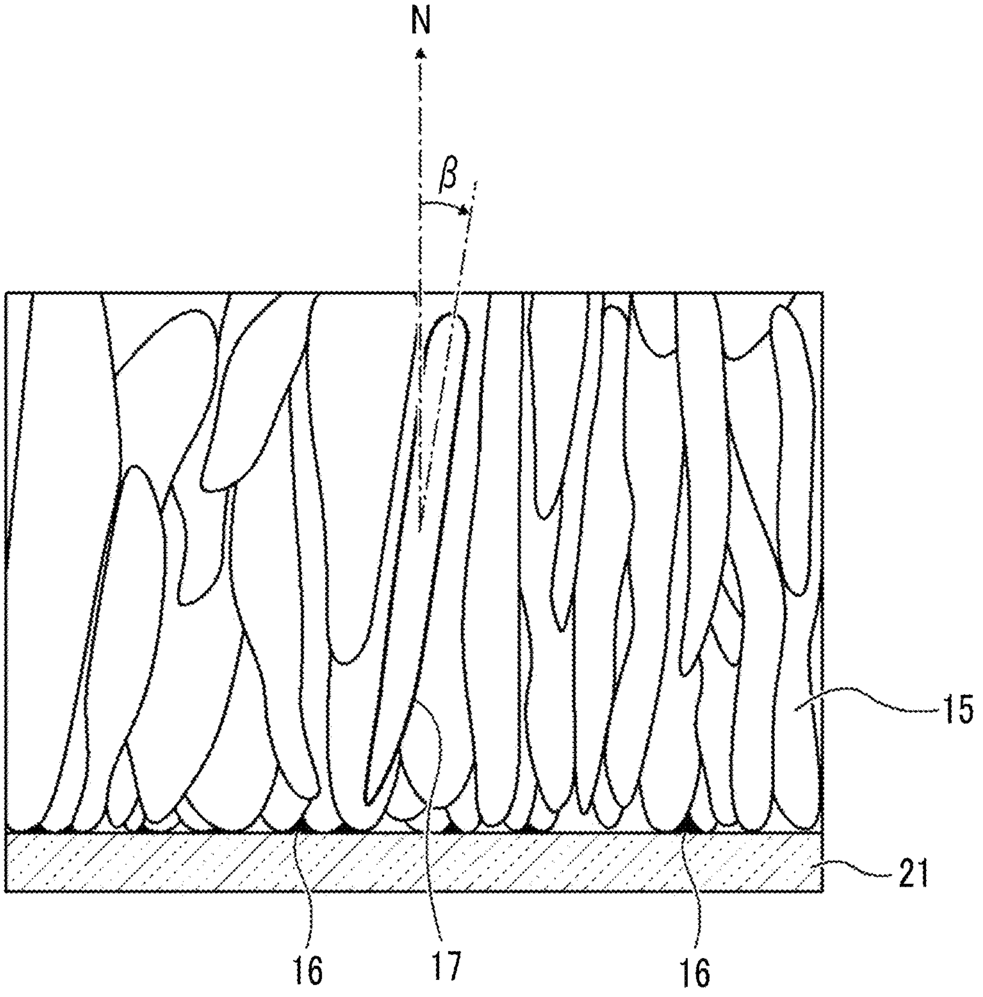
FIG. 4 is an enlarged schematic view of a piezoelectric film.

FIG. 4 is a view schematically illustrating the interface between the piezoelectric film 15 and the lower electrode layer 12, and the piezoelectric film 15. As illustrated in FIG. 4, a pyrochlore phase 16 that grows in a triangular shape in the cross section is formed at the interface between the piezoelectric film 15 and the lower electrode layer 12; however, other regions are constituted of a perovskite-type oxide. In a case where the piezoelectric film 15 is formed on a metal layer having the (111) plane parallel to the substrate surface 11*a*, a pyrochlore phase having a thickness of several hundred nm is formed. However, in the piezoelectric laminate and the piezoelectric element according to the present embodiment, the thickness of the pyrochlore phase 16 can be set to be approximately 100 nm or less (see Examples below).

In the X-ray diffraction pattern obtained by an X-ray diffraction measurement of the piezoelectric film 15, the intensity ratio of the pyrochlore phase to the perovskite phase in the piezoelectric film, which is expressed by the following expression, is preferably 2% or less.

$$py(222)/\{pr(100)+pr(110)+pr(111)\}\times100\%$$

Here,

- py (222) is a peak intensity of a (222) plane of the pyrochlore phase,
- pr (100) is a peak intensity of a (100) plane of the perovskite phase,
- pr (110) is a peak intensity of a (110) plane of the perovskite phase, and
- pr (111) is a peak intensity of a (111) plane of the perovskite phase.

In a case where the intensity ratio of the pyrochlore phase to the perovskite phase in the piezoelectric film is 2% or less, sufficiently high piezoelectric characteristics can be obtained without inhibition of the piezoelectricity due to the perovskite phase.

As illustrated in FIG. 4, the piezoelectric film 15 is preferably a columnar structure film containing a large number of columnar crystal bodies 17. It is preferable that a large number of columnar crystal bodies 17 extend non-parallelly with respect to the substrate surface 11*a* to be a uniaxial alignment film in which the crystal orientations are aligned. In a case of adopting an alignment structure, it is possible to obtain larger piezoelectricity. The piezoelectric film 15 which is a columnar structure film can be obtained, for example, by the method described in JP2008-270704A.

Further, in the example illustrated in FIG. 4, the longitudinal direction of the columnar crystal has an inclination β of 1° or more with respect to the normal line of the substrate. This means that the alignment plane of the piezoelectric film 15 has an inclination of 1° or more with respect to the surface of the substrate. Here, the alignment plane is a (100) plane or a (001) plane. This because, in this example, the lattice constants on the a-axis and the c-axis in the perovskite structure are substantially the same, and thus it is not possible to distinguish which plane is the alignment plane in the analysis by XRD (X-ray diffraction). It is noted that in the following description, the description "perovskite phase (100)" means the (100) plane or the (001) plane, which is the alignment plane. Since the (111) plane of the metal layer that constitutes the region (that is, the first layer 21) adjacent to the piezoelectric film 15 of the lower electrode layer 12 is tilted by 1° or more, the piezoelectric film 15 formed on the upper layer thereof tends to exhibit substantially the same inclination due to the influence of the aligning properties of the metal layer.

The piezoelectric element 1 according to each of the above embodiments can be applied to an ultrasonic device, a mirror device, a sensor, a memory, and the like.

EXAMPLES

Hereinafter, Examples and Comparative Examples of the present disclosure will be described.

Production of Examples 1 to 13 and Comparative Example 1

As a substrate, a 25 mm square silicon substrate with a thermal oxide film was used.

<Lower Electrode Layer>

A Ti layer or TiW layer having a thickness of 20 nm as a second layer of the lower electrode layer was formed on the above-described substrate by radio frequency (RF) sputtering. The sputtering conditions were as follows.

—Sputtering Conditions for Second Layer—

Distance L between target and substrate (see Table 1, varies depending on each example)

Target input power P (see Table 1, varies depending on each example)

Ar gas pressure: 0.5 Pa

Substrate temperature: 350° C.

In Comparative Example 1, the distance between target and substrate and the input power shown in Table 1 were used. In Examples 1 to 11, in order to increase the amount of oxygen mixed from the background, the distance between target and substrate was increased, or the input power was reduced to reduce the film formation rate. In Example 12, a gas obtained by mixing 1% oxygen with Ar was used as a sputter gas. In addition, in Example 13, a gas obtained by mixing 1% nitrogen with Ar was used as a sputter gas. In Examples 1 to 11 and Comparative Example 1, oxygen contained in the background in the chamber was mixed into the film.

Next, an Ir layer having a thickness of 150 nm was continuously formed as the first layer on the second layer. The sputtering conditions were as follows.

—Sputtering Conditions for First Layer—

Distance between target and substrate: 100 mm

Target input power: 600 W

Ar gas pressure: 0.1 Pa

Substrate temperature: 350° C.

<Piezoelectric Film>

The substrate with the lower electrode layer was placed an RF sputtering apparatus, and an Nb-doped PZT film was formed, where the Nb-doping amount to the B site was set to 12 at %. The sputtering conditions at this time were as follows.

—Sputtering Conditions for Piezoelectric Film—

Distance between target and substrate: 60 mm

Target input power: 500 W

Vacuum degree: 0.3 Pa $Ar/O_2$ mixed atmosphere (02 volume fraction: 2.0%)

Substrate temperature setting: 700° C.

<Upper Electrode Layer>

The substrate on which an Nb-doped PZT film was formed as described above was placed in an RF sputtering apparatus to form an upper electrode layer having a two-layer structure of Ti 20 nm and Au 100 nm. The sputtering conditions at this time were as follows.

—Sputtering Conditions for Upper Electrode Layer—

Distance between target and substrate: 100 mm

Target input power: 600 W

Ar gas pressure: 0.5 Pa

Substrate temperature: room temperature (RT)

(Evaluation)

Each Example and Comparative Example were evaluated as follows.

<Amount of Oxygen or Nitrogen in First Layer of Lower Electrode Layer>

In the production methods of Examples 1 to 13 and Comparative Example 1 above, each of samples in which the first layer of the lower electrode layer was formed on a substrate under each of the sputtering conditions was prepared and subjected to the secondary ion mass spectrometry (SIMS) analysis in which the content of elements in the film was measured while cutting was carried out from the surface side of the first layer by irradiation with $Ar^+$ ions.

Figure 5:
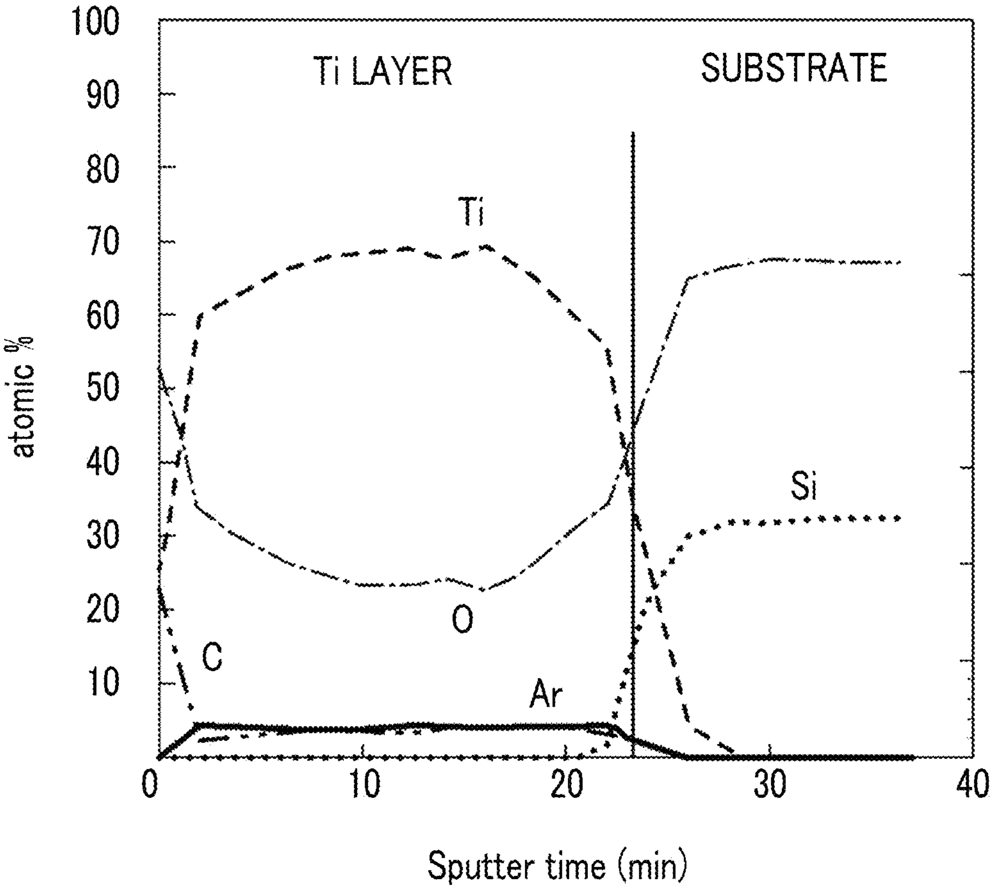
FIG. 5 is SIMS data showing an oxygen content in a second layer of the lower electrode layer.

FIG. 5 shows the SIMS data for Example 3.

The sputtering time on the lateral axis corresponds to a position in the film thickness direction, and the position on the lateral axis 0 is the surface of the first layer (here, the Ti layer).

From the SIMS data, the proportion of the oxygen element to all the elements contained in the first layer was calculated. It is noted that in the case of Example 12, the proportion of the nitrogen element to all the elements contained in the first layer was calculated. The results are shown in Table 1.

<Inclination of (111) Plane of First Layer of Lower Electrode Layer from Substrate Surface>

Figure 6:
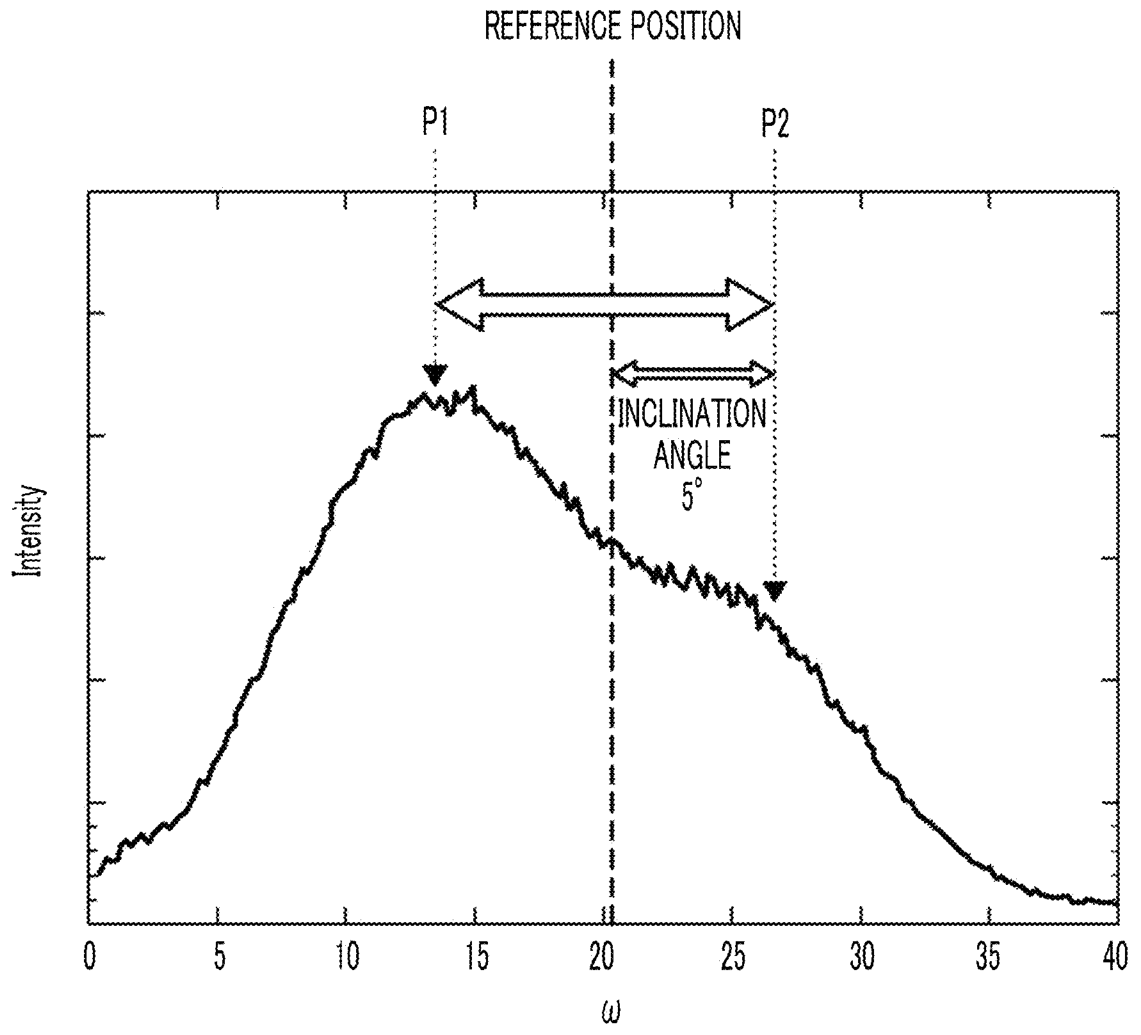
FIG. 6 is rocking curve measurement data showing an inclination of an Ir (111) plane.

Regarding Examples and Comparative Examples, the sample before forming the upper electrode layer was used to evaluate the crystallinity of the first layer by XRD using RINT-ULTIMA III manufactured by Rigaku Corporation. Specifically, the inclination of the peak of the Ir (111) plane was determined, by the rocking curve measurement, from the deviation of the position of the peak of the Ir (111) plane from that of the Ir peak in a case where the (111) plane was not inclined. FIG. 6 is the rocking curve measurement data of Example 3. The reference position shown in the figure is a position of a peak of the (111) plane, where the peak appears in a case where the (111) plane is parallel to the surface of the substrate. The example shown in FIG. 6 has a first peak P1 and a second peak P2, and the split width therebetween is 10°. The center of the split width between the first peak P1 and the second peak P2 is the reference position, and in this example, it is meant that the (111) plane of the first layer is inclined by 5° with respect to a state where it is parallel to the substrate.

<Evaluation of Pyrochlore Phase Thickness>

Regarding Examples and Comparative Examples, transmission electron microscope (TEM) images were captured, and the thickness of the pyrochlore phase was determined from the TEM images. In the piezoelectric film, the contrast in the TEM image differs between the pyrochlore phase and the perovskite phase, and thus it is possible to specify the region of the pyrochlore phase and calculate the thickness thereof. It is noted that it was observed that columnar crystal bodies of the perovskite-type oxide were formed in the portion of the piezoelectric film other than the pyrochlore phase. The thickness of the pyrochlore phase was calculated as an average film thickness since the pyrochlore phase was not uniformly formed on the surface of the lower electrode layer.

Specifically, the contrast adjustment function of the image processing software is used to binarize the original image at a predetermined threshold value, and the edge extraction function of the image processing software is used to extract the pyrochlore phase. In this case, the threshold value is such that noise is removed as much as possible and only those that can be clearly distinguished from the pyrochlore phase are extracted. In a case where the outline of the pyrochlore-type oxide layer is unclear in the binarized image, the outline is empirically drawn while looking at the binarized image, and the inside thereof is filled. The area of the extracted pyrochlore phase is calculated from the number of pixels obtained from the image processing software and divided by the visual field width of the TEM image to obtain the average layer thickness. As the image processing software, Photoshop (registered trade name) was used here.

Table 1 shows the thickness of the pyrochlore phase obtained as described above.

<Evaluation of Peak Intensity Derived from Pyrochlore Phase>

The PZT crystallinity evaluation was carried out by XRD using RINT-ULTIMA III manufactured by Rigaku Corporation. From the XRD chart obtained from each example, the intensity of the pyrochlore phase (222), which is a different phase, was determined. In the XRD chart, the region where the pyrochlore phase (222) was detected was in the vicinity of 29°, and the peak intensity derived from the pyrochlore phase (222) was adopted as a peak intensity obtained by removing the noise derived from the background, from the obtained XRD diffraction intensity (counts).

In addition, from the XRD chart, py (222)/{pr (100)+pr (110)+pr (111)}×100% was calculated.

The intensity from each plane was determined as follows.

The average value of the number of counts in a case where 2θ is 25° to 28° is defined as the noise N derived from the background.

The intensity of py (222) was defined as the value obtained by eliminating N from the maximum number of counts in a range in which 2θ was 28° to 30°.

The intensity of pr (100) was defined as the value obtained by eliminating N from the maximum number of counts in a range in which 2θ was 21° to 23°.

The intensity of pr (110) was defined as the value obtained by eliminating N from the maximum number of counts in a range in which 2θ was 30° to 32°.

The intensity of pr (111) was defined as the value obtained by eliminating N from the maximum number of counts in a range in which 2θ was 37.5° to 39.5°.

Figure 7:
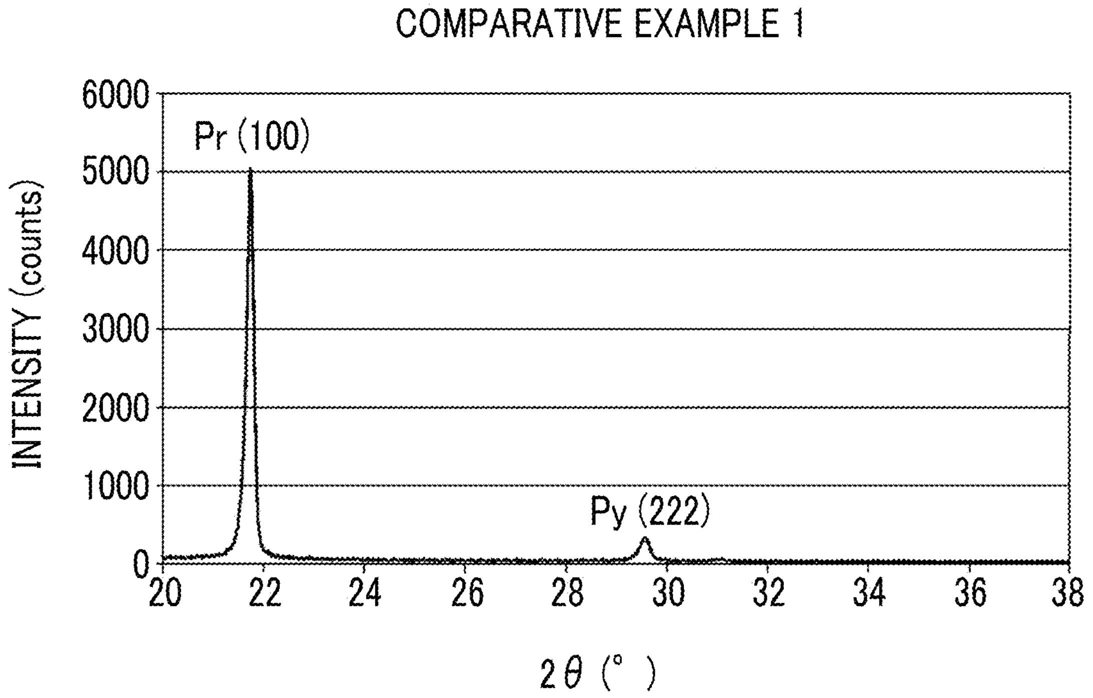
FIG. 7 is an XRD chart showing the crystallinity of a piezoelectric film of Comparative Example 1.
Figure 8:
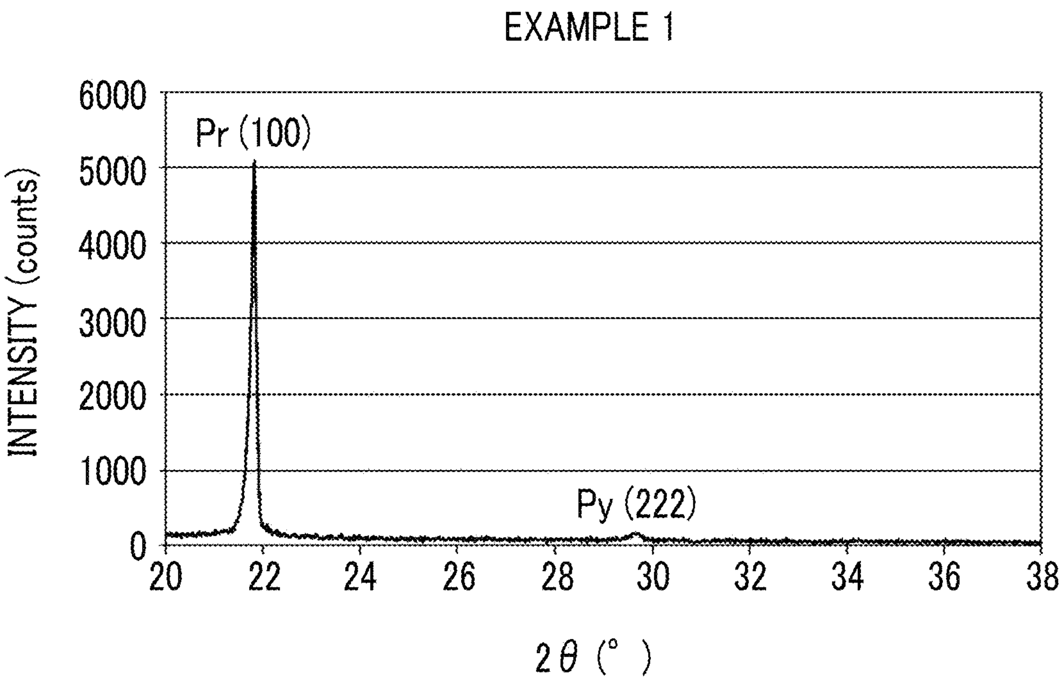
FIG. 8 is an XRD chart showing the crystallinity of a piezoelectric film of Example 1.
Figure 9:
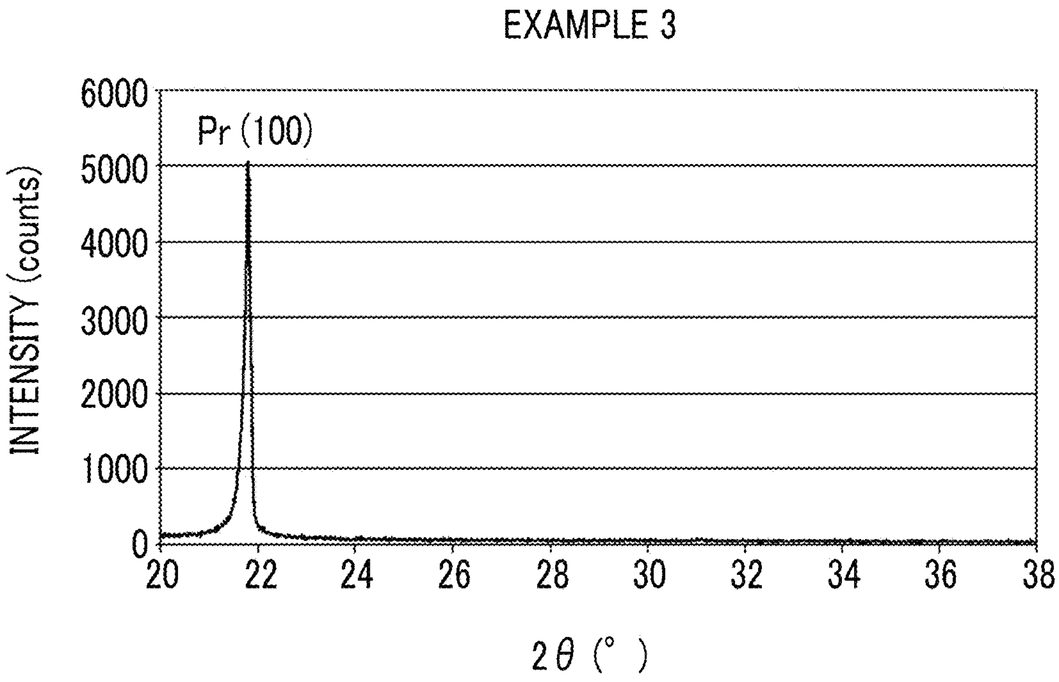
FIG. 9 is an XRD chart showing the crystallinity of a piezoelectric film of Example 3.

As an example of the XRD measurement for evaluating the peak intensity derived from the pyrochlore phase, FIG. 7 shows an XRD chart from Comparative Example 1, FIG. 8 shows an XRD chart from Example 1, and FIG. 9 shows an XRD chart from Example 3. In FIG. 7 to FIG. 9, the peak values of the perovskite phase (100) are the same. On the other hand, there is a difference in the pyrochlore phase (222). As shown in FIG. 7, in Comparative Example 1, there is a clear peak of the pyrochlore phase (222) in the vicinity of 29°. In Example 1 shown in FIG. 8, the peak value of the pyrochlore phase (222) is decreased as compared with the case of Comparative Example 1, and In Example 3 shown in FIG. 9, the pyrochlore phase (222) peak is not observed. In examples in Table 1 including Example 3, in which the peak intensity of the pyrochlore phase (222) was 40 or less, almost no peak was observed in the XRD chart, which was equivalent to the background.

It is noted that even in a case where a peak of the pyrochlore phase is hardly observed in the XRD chart as in Example 3, a slight amount of the pyrochlore phase is observed between the lower electrode layer and the piezoelectric film in the TEM image, the thickness of the pyrochlore phase is calculated.

<Evaluation of Piezoelectric Characteristics>

The piezoelectric constant $d_{31}$ was measured for the evaluation of the piezoelectric characteristics of each of Examples and Comparative Examples.

The piezoelectric element produced as described above was cut into a strip shape of 2 mm×25 mm to produce a cantilever, and according to the method described in I. Kanno et. al. Sensor and Actuator A 107 (2003) 68, the measurement of the piezoelectric constant $d_{31}$ was carried out by applying a voltage of sine wave of −10 V±10 V. The results are shown in Table 1.

is tilted by 1° or more with respect to the surface of the substrate, the pyrochlore phase could be suppressed as compared with Comparative Example 1, and a large piezoelectric constant $d_{31}$ was obtained. As the oxygen amount or the nitrogen amount in the second layer is larger, the inclination of the (111) plane of the first layer tends to be larger. In addition, a high inhibitory effect on the pyrochlore phase was obtained in a case where the inclination of the (111) plane was 3° or higher, and a particularly high inhibitory effect was obtained in a case where the inclination of the (111) plane was 6° to 8°. In addition, there was a tendency that a larger piezoelectric constant could be obtained as the number of pyrochlore phases was smaller.

The piezoelectricity of the piezoelectric film could be improved by controlling the crystallinity of the surface on which the piezoelectric film of the lower electrode layer was laminated so that the growth of the pyrochlore phase was hindered. In a region of the lower electrode layer, which is adjacent to the piezoelectric film, noble metals such as Ir employed in present Examples, which are metals having a high melting point, are often used. These noble metals have the characteristic that they are naturally preferentially aligned in the (111) plane and grow in a case of being subjected to the sputter film formation. In a case where the (111) plane is formed on the surface of the lower electrode layer, the pyrochlore layer easily grows. In present Examples, it was revealed that the pyrochlore phase can be suppressed by displacing the surface of the lower electrode layer from the (111) plane. According to this method, it is not necessary to insert an additional layer such as a seed

TABLE 1

| | Lower electrode layer: Second layer: Material | Lower electrode layer: Second layer: Distance between target and substrate L [mm] | Lower electrode layer: Second layer: sputter input power P during film formation [W] | Lower electrode layer: Second layer: Oxygen amount or Nitrogen amount [at %] | Lower electrode layer: First layer Inclination α of (111) plane [°] | Piezoelectric film: Pyrochlore phase: Thickness [nm] | Piezoelectric film: Pyrochlore phase: (222) peak intensity [counts] | Piezoelectric film: Pyrochlore phase: Peak intensity ratio [%] | Piezoelectric characteristics Piezoelectric constant $d_{31}$ [pm/V] |
|---|---|---|---|---|---|---|---|---|---|
| Example 1 | Ti | 100 | 500 | 10 | 2 | 100 | 130 | 1.73 | 196 |
| Example 2 | Ti | 100 | 400 | 20 | 3 | 40 | 30 | 0.40 | 212 |
| Example 3 | Ti | 100 | 300 | 30 | 5 | 35 | 22 | 0.29 | 218 |
| Example 4 | Ti | 100 | 200 | 40 | 6 | 20 | 13 | 0.17 | 228 |
| Example 5 | Ti | 100 | 100 | 50 | 8 | 15 | 0 | 0.00 | 236 |
| Example 6 | TiW | 100 | 400 | 20 | 3 | 30 | 21 | 0.28 | 216 |
| Example 7 | TiW | 100 | 300 | 30 | 5 | 20 | 9 | 0.12 | 222 |
| Example 8 | TiW | 100 | 200 | 40 | 7 | 15 | 0 | 0.00 | 231 |
| Example 9 | Ti | 120 | 600 | 15 | 3 | 80 | 90 | 1.20 | 201 |
| Example 10 | Ti | 150 | 600 | 25 | 5 | 40 | 35 | 0.47 | 208 |
| Example 11 | Ti | 200 | 600 | 40 | 8 | 20 | 9 | 0.12 | 216 |
| Example 12 | Ti | 100 | 600 | 20 + N | 4 | 30 | 17 | 0.23 | 209 |
| Example 13 | Ti | 100 | 600 | 25 + O | 6 | 35 | 28 | 0.37 | 215 |
| Comparative Example 1 | Ti | 100 | 600 | 5 | 0 | 200 | 420 | 5.60 | 180 |

In Table 1, the numerical value shown in the column of the oxygen amount or the nitrogen amount of the second layer for Examples 1 to 11, 13 and Comparative Example 1 is the oxygen amount, and it is the nitrogen amount for Example 12. In addition, +N in Example 12 means that the nitrogen gas is added to the sputter gas, and similarly, +O in Example 13 means that the oxygen gas is added to the sputter gas.

In all of Examples 1 to 13, in which the (111) plane of the Ir layer which is the first layer of the lower electrode layer, where the first layer is in contact with the piezoelectric film, layer for controlling crystallinity, and it is not necessary to change the film configuration since only the crystallinity is controlled, whereby an increase in cost can be suppressed.

The disclosure of JP2020-166409 filed on Sep. 30, 2020, is incorporated in the present specification by reference in its entirety.

All documents, patent applications, and technical standards described in the present specification are incorporated herein by reference, to the same extent as in the case where each of the documents, patent applications, and technical standards is specifically and individually

What is claimed is:

1. A piezoelectric laminate comprising, on a substrate in the following order:

a lower electrode layer; and a piezoelectric film;

wherein a region of the lower electrode layer, the region being in contact with the piezoelectric film, is constituted of a metal layer, where a (111) plane of the metal layer has an inclination of 1° or more and 15° or less with respect to a surface of the substrate, and the piezoelectric film contains a perovskite-type oxide containing Pb.

2. The piezoelectric laminate according to claim 1, wherein a metal constituting the metal layer is at least one of Ir, Pt, Au, Mo, Ta, or Al.

3. The piezoelectric laminate according to claim 1, wherein the lower electrode layer includes a first layer that consists of the metal layer and a second layer that is adjacent to the first layer and is provided on a substrate side, and the second layer contains at least one of Ti or W as a main component and contains more than 5 at % and less than 50 at % of oxygen or nitrogen.

4. The piezoelectric laminate according to claim 1, wherein in an X-ray diffraction pattern for the piezoelectric film, an intensity ratio of a pyrochlore phase to a perovskite phase in the piezoelectric film, which is represented by the following expression, is 2% or less, $$py\ (222)/\{pr\ (100)+pr\ (110)+pr\ (111)\}\times 100\%$$

here, py (222) is a peak intensity of a (222) plane of the pyrochlore phase, pr (100) is a peak intensity of a (100) plane of the perovskite phase, pr (110) is a peak intensity of a (110) plane of the perovskite phase, and pr (111) is a peak intensity of a (111) plane of the perovskite phase.

5. The piezoelectric laminate according to claim 1, wherein the piezoelectric film has a columnar crystal film structure consisting of a large number of columnar crystals.

6. The piezoelectric laminate according to claim 5, wherein a (100) or (001) plane of the columnar crystal has an inclination of 1° or more with respect to the surface of the substrate.

7. A piezoelectric element comprising:

the piezoelectric laminate according to claim 1; and an upper electrode layer provided on the piezoelectric film of the piezoelectric laminate.

8. The piezoelectric element according to claim 7, wherein the upper electrode layer contains a metal or a metal oxide, containing at least one of Ir, Pt, Au, Ti, Mo, Ta, Ru, or Al.

9. The piezoelectric laminate according to claim 1, where the (111) plane of the metal layer has the inclination of 1° or more and 8° or less with respect to the surface of the substrate.

* * * * *